Oct. 19, 1965 R. R. LINDSTRAND 3,213,325

WELDABLE TERMINAL

Filed Oct. 5, 1962

INVENTOR:
Robert R. Lindstrand

By Alan C. Rose
Attorney

United States Patent Office 3,213,325
Patented Oct. 19, 1965

3,213,325

WELDABLE TERMINAL

Robert R. Lindstrand, Los Angeles, Calif., assignor to Litton Precision Products, Inc., Van Nuys, Calif.

Filed Oct. 5, 1962, Ser. No. 228,535
7 Claims. (Cl. 317—101)

This invention relates to a terminal connection for attaching circuit components or leads to a circuit board or terminal board, and is applicable to both wired and printed circuit boards as well as terminal boards.

The last decade has been a revolution in the hardware of electronic circuitry. After nearly 20 years of manufacturing bulky, hand-wired, electronic chassis, manufacturers acceded to the demand for miniaturization and started seeking ways to make electronic chassis more compact. The printed circuit board, which did away with most hand wiring, came into widespread use. Terminal boards for holding components made circuit layout more efficient. With these and other improvements, the industry strove to find other ways to decrease the size and cost of the manufacture of circuit boards.

As valuable as printed circuit boards and similar devices were, they still had many disadvantages. Soldering techniques proved to be a problem. Also, the boards were not always able to stand up under severe operating conditions. At the present time in many applications, a primary requirement of the circuit board is extreme reliability under severe conditions of shock, vibration and thermal stress. As used in this patent, the terms "circuit board" and "insulator board" are equivalents and embrace printed circuit boards, terminal boards and other similar devices.

The hardware of the circuit board has come to assume a critical significance, and the industry has realized the need for rugged connectors which will reliably secure components to a circuit board. There has been an unsatisfied need for a connector which will be rugged yet miniature, reliable yet simple, but economical to manufacture and install. Such a connector must also provide strong mechanical support for the component to be connected, and must hold the component so as to give ease and facility in soldering, welding, fusing or other connecting methods. Such a connection should not require the use of skilled personnel to make connections which will stand up under extremely adverse operating conditions. Increased labor costs and the competition for skilled personnel have made the development of some means of connection having the above advantages highly desirable. When skilled personnel are not available, costly time-consuming training is usually required for the connecting techniques which have been used up to the present time.

Accordingly, a general object of the present invention is to increase the reliability of the connections between electrical components and their associated circuit board. A more specific object of this invention is to provide a terminal connection which will be highly resistant to extreme shock, vibration, and thermal stresses. Such a terminal should allow an easy and reliable connection by unskilled personnel.

To attain these objects, the present invention contemplates a unique weldable terminal and connector of particular mechanical and electrical properties which may be readily funneled or swaged to a hole in the circuit board. In some applications, it may be attached to the board by soldering. Such a connector may be formed from a shouldered tubular member with an inside diameter chosen to receive a circuit component lead snugly.

The funneling or swaging causes a firm mechanical and electrical bond between the connector and the circuit board. The tubular portion snugly receiving the component lead performs the dual function of holding the component lead in place for ease of welding and of providing a strong mechanical connection. As will be developed later, the characteristics of the Monel material used in the preferred embodiment allow a rugged and reliable welded connection to be made by unskilled personnel.

In recent years electronic welding techniques have gained in popularity over other fusing techniques, such as soldering. Welded connections characteristically exhibit increased resistance to shock, vibration and severe thermal stresses. There is an enhanced consistency of connection when the parent metals are homogeneously fused, rather than fused with a binder. In addition, advanced electronic resistance welding techniques have made it possible to get local fusion at the connection with only a few milliseconds of resistance heat application. Such short intervals of heat do not set up thermal stresses which might otherwise cause degradation and damage to adjacent electronic parts and connectors.

There have, however, been several basic problems in connection with welding. There has been the problem of holding the component lead to the terminal for ease of welding. And most important there has been the fact that the production of good welds is difficult for unskilled personnel where there is a variation in the type of metals being welded.

The leads on commercially available electronic components, such as resistors, capacitors, diodes, transistors, transformers, etc. commonly fused to circuit board connectors, are not all made of the same material. Consequently, it is tricky and expensive, even for skilled personnel, to get consistently strong welds. This is because a strong weld requires a proper choice of welding pressure, time interval and welding electrode material to suit each different component lead material.

Thus, it is necessary to have a selection of electrodes and a corresponding chart for each electrode showing the proper timing interval and pressure for component material of the size being welded.

It has been the experience in the prior art that to get a strong weld requires a very accurate setting of the timing interval, because the strength of the weld falls off very rapidly if the timing interval is even slightly too long or too short. This narrow allowable timing interval is disadvantageous because it places a great burden on the welder to properly interpolate the timing interval chart in relation to the characteristics and size of the component lead material being welded. Improper interpolation results in a weak weld. To avoid this, highly skilled welders are required. These people are not always available; and there has been an urgent need in the industry for a connector with which unskilled personnel can easily and reliably weld component leads to circuit boards.

Accordingly, a specific object of this invention is to provide a terminal which will provide a strong mechanical connection between the component lead and the terminal, and which will position the components for facility in welding. Such a terminal should permit rugged and reliable welds by unskilled personnel, and should allow the use of a single type of electrode and a non-critical timer interval setting for welding a component lead to the connector, no matter what the metal used in the lead.

To attain these objects the present invention contemplates a unique terminal of tubular configuration formed out of carefully chosen material which holds the component lead snugly, and is characterized by welding techniques utilizing such tubular configuration and specially chosen metal to make it possible to use the same welding electrodes for leads of all materials.

This unique terminal makes the timing interval setting non-critical by permitting strong welds within a broad range of timer settings. In fact, the range is so broad that for many lead materials it is possible to get acceptable welds when going from one lead material to another without changing the timer setting.

The lead is inserted to fit snugly in the tubular terminal which provides a strong mechanical bond, as well as the mechanical rigidity for the component lead, which is desirable for ease in welding. The tubular configuration of the terminal eliminates the need for separate fixtures to hold the component lead in contact with the terminal during the welding operation.

In prior art terminal welding techniques, the usual situation involves one electrode touching the terminal and another electrode in contact with the component lead. In the prior art, a change in the material of the inserted lead usually requires a complete change of the welding electrodes and the timing interval setting, which setting was usually of a critical nature. This change of electrodes and timing interval was necessary because proper welding condition settings are dependent on the relative properties of the electrode and the metal it is contacting.

The present invention is designed for the application of both welding electrodes to the tubular sides of the terminal at that portion where it encloses the inserted component lead. Since only the tubular terminal metal is in contact with the electrodes, the welding characteristics of the terminal are controlling. Therefore, the welding conditions remain substantially constant despite a change in the material of the inserted lead.

When the materials of the inserted leads very widely, a change in timer interval setting should be made to get optimum welding conditions. However, because of the tubular configuration, the setting for optimum conditions is not a critical setting and exists within a rather wide range as compared with the critical settings required where the techniques used involve direct electrode contact with the component lead. The welding electrode will remain the same for all of the component lead materials in common use. Therefore, a relatively unskilled welder can use a chart adapted to that electrode to find the optimum setting for different lead materials. Because of the wide range, there is a large margin of error which allows good welds even when there is poor interpolation of the chart in relation to a particular lead material and size. And in many cases, there will not even be a need to change the settings for a new lead material.

When the prior art technique of clamping one electrode to the terminal and the other electrode to the component lead is used, there is only one current path for the welding current and it is clear that the welding current will pass through the boundary between the two metals in order to fuse them. However, when a tubular terminal is used, there are three possible current paths between the two electrodes applied to the sides of the tube: One path is around the circumference of the tube without passing through the component lead material; another path is perpendicularly into the walls of the component terminal and through the component lead material in a direct path from electrode to electrode. A third possibility is a combination of the previously described current paths.

The most efficient weld results when the direct current path is utilized. This produces a dual weld: One weld on the side of the component lead where the current enters, and one weld on the side of the component lead where the current exits. This efficient dual weld is possible when the inserted lead wire has a relatively high thermal and electrical conductivity when compared to the tubular terminal. Under these conditions, the welding current path is through the thin walls of the tube straight through the component lead, thus forming a weld at each side of the lead. The welding current chooses this direct path when the thermal and electrical conductivity of the component lead is much higher than that of the circumferential tube, because the path of least resistance is perpendicularly through the walls of the tube and through the highly conductive component lead material.

General resistance welding practice is to clamp one electrode to the terminal and the other to the component lead. When this method is employed, care must be taken in the choice of welding electrodes. Otherwise, the electrode will tend to fuse itself to the lead material or terminal. This is known as electrode "sticking" as is highly undesirable. "Sticking" can be caused by improper setting of the timer interval and electrode pressure, but even with proper settings "sticking" may occur if the electrode does not have a higher electrical conductivity and heat conductivity than the metal it is touching.

The way to avoid "sticking" when proper time and pressure settings are used is to carefully select the proper electrode material. Under the conventional welding practice described above, this usually means a change of electrode material for each change in component lead material. This might involve several electrode changes for one circuit board with the attendant waste of time and effort.

Accordingly, an important object of this invention is to provide a terminal to which welding electrodes will not stick irrespective of the composition of the lead material.

In accordance with the present invention this object has been achieved by restricting the contact of both electrodes to the sides of the tubular terminal. The inserted lead never touches the electrodes. Proper choice of the terminal material, i.e. so that it has a lower thermal and electrical conductivity than any of the electrodes in common use, eliminates "sticking" of the electrodes to the terminal component lead for practical purposes when the correct pressure and timer interval settings are present. The proper choice of material for the connector was a very great problem, because of the diverse electrical and mechanical requirements imposed.

The material must be highly weldable. In general, weldability depends on low thermal and electrical conductivity. The material must have high resistivity, i.e. low conductivity in comparison with the materials commonly used for component leads. Under these circumstances, the welding current will pass principally through the component lead instead of around the walls of the tube. In addition to being highly weldable, the material must be highly machinable so that large quantities of accurately machined terminals can be turned out by economical, automatic screw machine methods. Good machinability is also desirable so that proper tolerances may be maintained for a snug fit of the component lead, so that it will be held firmly in position. The material should be solderable, for connection to the circuit board conductors. And it also must be tough and mechanically rigid, once it is formed, so that the swaging or funneling will keep it in place on the circuit board and not allow it to work loose.

Accordingly, another object of the invention involves the discovery of a material for an electrical terminal which will have all of the characteristics listed in the preceding paragraph.

With regard to particular metals, nickel is known to have good welding properties. Although most nickel alloys are highly weldable, they are not very machinable. Copper and most brasses are not very weldable and require great care in the selection of welding electrodes. It is difficult to find metals which will satisfy the diverse requirements set forth above. Alloys seem to offer the best choice.

For ease of soldering to the circuit board conductors, a copper alloy is desirable. Fortunately, certain copper alloys have been discovered to possess the other requisite characteristics. For the purpose of the present invention, the copper must be alloyed to reduce the thermal and electrical conductivity, and to increase the machinability of the terminals. The amount of alloying components vary widely; for example, a high silicon bronze having a composition of 96.95 percent copper, 2.95 percent silicon, and 0.10 percent iron is satisfactory. However a preferred class of alloys, the Monels, are only about ¼ or ⅓ copper, with the remainder being mostly nickel. Furthermore, in addition to all of the desired properties set forth above, Monel is highly corrosion resistant.

The extremely low thermal and electrical conductivity of the Monels allows excellent welds. The properties of rigidity and machinability allow it to be conveniently and economically manufactured into a terminal and assembled to the board and, additionally, will insure a snug fit within the component lead.

R-Monel is an ideal metal for this application, because it has low thermal and electrical conductivity. It is excellent for resistance welding and has the high resistivity necessary for the tubular welding method described in this specification. It has good machinability characteristics and is classed as being suitable for automatic screw machine use. R-Monel exhibits all the characteristics of standard Monel except that it has added elements which give it free machinability.

An important feature of this invention involves a method of connecting components to a circuit board by use of a shouldered tubular terminal which is machined from Monel or a similar metal. This terminal is swaged and may also be soldered to the board to receive an inserted component lead which it positions firmly for welding at two opposed points by means of resistance welding electrodes clamped to the outside of the tubular terminal. This terminal has a much higher electrical resistivity than any component lead likely to be inserted, and this causes the current to pass through the component lead rather than around the walls of the terminal. A weld is formed at the two points where the current passes through the walls into the component lead.

Another important feature of this invention is the use of Monel or a similar metal in a shouldered tubular terminal for reliably and easily connecting circuit components to a circuit board. Monel is chosen because it has the necessary characteristics of good machinability, excellent weldability, low thermal and electrical conductivity and toughness.

The novel features which are believed to be characteristic of the invention, both as to its organization and methods of operation, together with further objects and advantages thereof, will be better understood from the following description considered in connection with the accompanying drawings in which several embodiments of the invention are illustrated by way of example. It is to be expressly understood, however, that the drawings are for the purpose of illustration and description only, and are not intended as a definition of the limits of the invention.

In the drawings:

FIG. 1*a* is a cross-sectional view of a section of tube from which an illustrative terminal may be manufactured;

FIG. 1*b* is another cross-sectional view with dotted lines showing where machining cuts are to be made;

FIG. 1*c* is a side view of the finished terminal;

Figure 1:
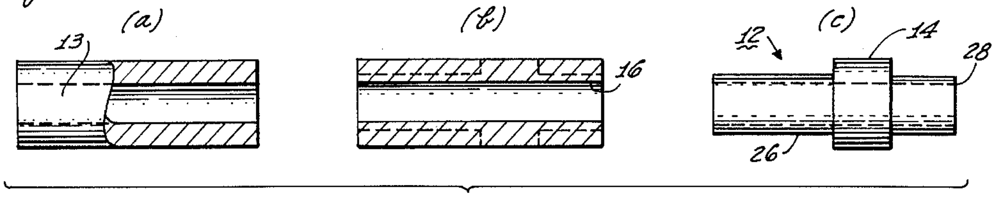

With reference to the drawings, FIG. 1 illustrates the process of manufacturing the terminal 12 from the tubing 13 which may, for example, be Monel. The part is cut to the proper length and machined to provide a shoulder 14 at an intermediate point along the terminal length. The inside 16 of the tube can be machined if desired to fit different size component leads.

The terminal 12 may be made of other alloys as set forth below, but is preferably made of Monel. Monel metal is preferred because it has the comparatively unique characteristics of good machinability, excellent weldability, and toughness coupled with low thermal and electrical conductivity. Monel is a generic term embracing a group of alloys with the following range of compositions: 60 to 70 percent nickel, 25 to 35 percent copper, 1 to 3 percent iron, 0.25 to 2.0 percent manganese, 0.02 to 1.5 percent silicon, and 0.3 to 0.5 percent carbon. The typical composition for the preferred R-Monel metal is 66.7 percent nickel, 30 percent copper, 1.7 percent iron, 1.1 percent manganese, 0.1 percent carbon, 0.05 percent silicon and 0.35 percent sulphur added to give free machinability.

Other commonly used terminal materials, such as brass and copper, generally present many difficult resistance welding problems due to their high electrical and thermal conductivity. The proper selection of welding electrodes for contact with the copper without "sticking" is very difficult, and this problem is increased if there is an attempt to weld circuit components, e.g. resistors, capacitors, diodes, transistors, etc., possessing leads of different materials. Furthermore, as will be presently disclosed, the suggested method uses a single metal contact method of welding in which low resistance brass and copper terminals are completely impractical.

R-Monel is ideal because of its good machinability compared to other weldable nickels. R-Monel allows high-speed cutting at from 80 to 110 feet per minute at a 0.015 inch feed as compared to 40 to 70 feet per minute for a rough cut at 0.015 inch feed for pure nickel.

With regard to other machinability features, R-Monel is not as soft as nickel and does not load up the cutting tools; the grain is better, and it does not tend to chip and powder.

R-Monel has an electrical conductivity of 290 ohms per circular mil foot as compared with 38 ohms per circular mil foot for navel brass, another common terminal material. Its thermal conductivity is 0.062 calories per square centimeter per centimeter per ° C. per second. This is only approximately ¼ the thermal conductivity of poorly weldable naval brass which is 0.280 calories per square centimeter per centimeter per ° C. per second. A means of comparing electrical conductivities of various metals is by use of the percent IACS which is the International Annealed Copper Standard. Copper has an IACS conductivity of 101 percent; R-Monel has an IACS conductivity of 3.58 percent; naval brass has an IACS conductivity of 26 percent. Comparison of the figures for navel brass and for R-Monel will illustrates the relatively low thermal and electrical conductivity of R-Monel, which makes R-Monel much more weldable than brass.

Another metal which possesses characteristics similar to R-Monel is silicon bronze A. Silicon bronze has a composition of 96.95 percent copper, 2.95 percent silicon and 0.10 percent iron. It is slightly more machinable than R-Monel, but has the disadvantage of having a slightly higher thermal and electrical conductivity. The electrical conductivity of silicon bronze A is 7 percent IACS, and its resistivity is 150 ohms per circular mil foot; its thermal conductivity is 0.090 calories per square centimeter per centimeter per ° C. per second. Both silicon bronze A and R-Monel are categorized as having characteristics of excellent resistance weldability and good machinability, as well as being suitable for automatic screw machine operations.

R-Monel and silicon bronze A are both copper alloys containing at least 20 percent copper, having electrical resistivities of at least 140 ohms per circular mil foot, having thermal conductivities below 0.1 calories per square centimeter per centimeter per ° C. per second, and characterized as having good machinability characteristics. The terminals in accordance with the present invention are preferably made of copper alloys having these physical properties.

Figures 2, 3, 4, 5, 6, 7, 8:
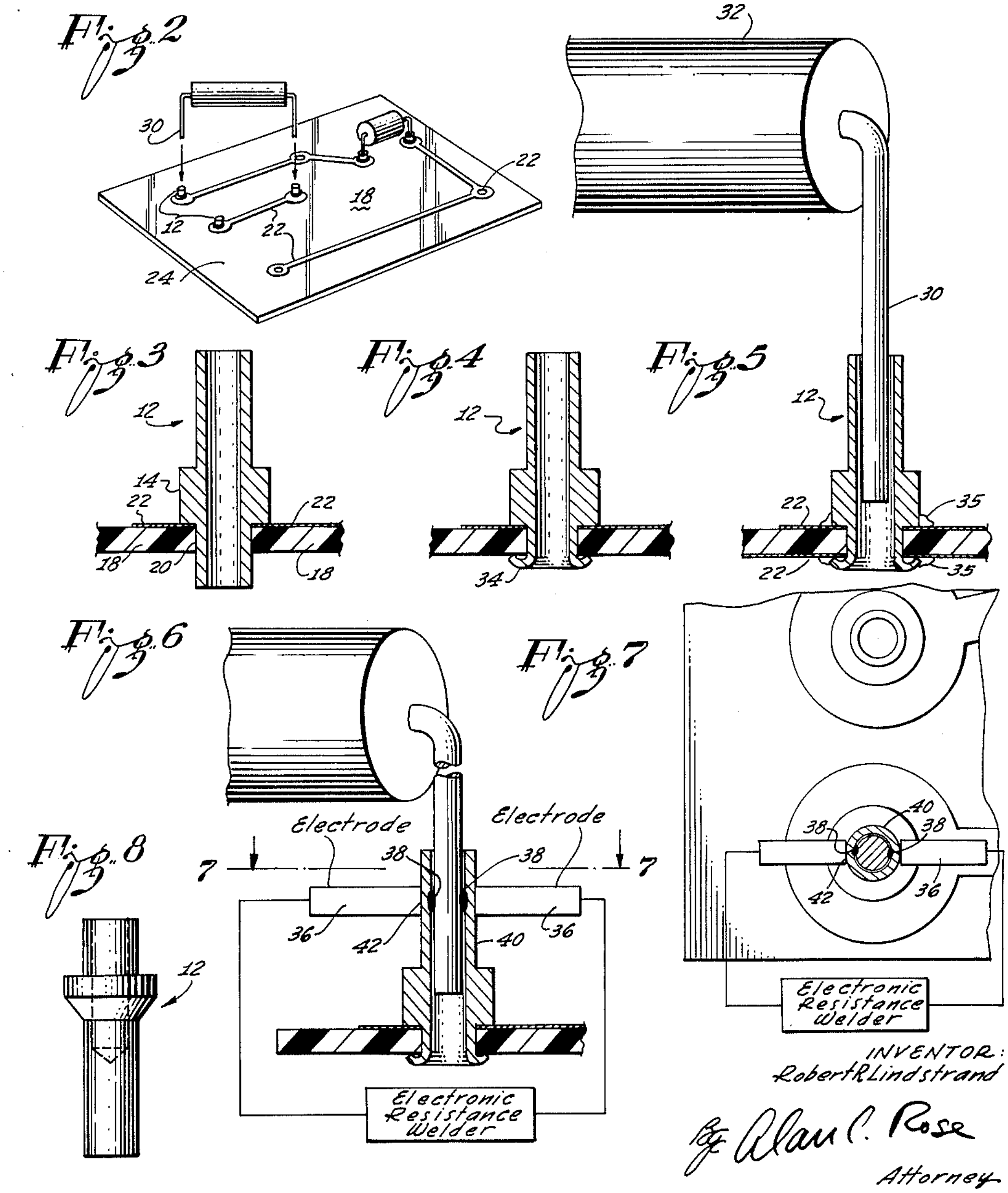
FIG. 2 is an isometric view of a circuit board with a conductive circuit pattern on one surface and components for attachment to the board through the use of terminals in accordance with the present invention.
FIG. 3 is a view, in section, of a terminal inserted in a circuit board.
FIG. 4 is a view, in section, of the terminal in FIG. 3 after being swaged to the circuit board.
FIG. 5 is a view, in section, of the swaged terminal of FIG. 4 with a component lead inserted ready for welding.
FIG. 6 is a view, in section, of the terminal and component lead of FIG. 5 after welding, and illustrates the dual weld resulting from the application of current to the electrodes.
FIG. 7 is a top view, in section, of the terminal and inserted lead after welding providing another view of the dual weld.
FIG. 8 is an elevational view of a suggested embodiment of the invention particularly adaptable to a riveted connection.

FIG. 2 shows a typical circuit board and component which are to be permanently and reliably connected together. The circuit board 18 has apertures 20 piercing the board and a conductive pattern 22 on one or both surfaces 24 surrounding said apertures. Terminals 12 are swaged into the board.

After machining terminal 12 may consist of a cylindrical body 26 with an annular shoulder 14 at an intermediate point along its length.

Such a configuration is well suited for connection to a circuit board by means of swaging or funneling. Other applications of the terminal may require other connective methods, such as rivet-type connection or soldering.

If it is desired to use a rivet-type connection, then the terminal, such as the one illustrated in FIG. 8, may be machined from a piece of solid rod stock and a hole drilled in one end to receive the component lead. The solid end is inserted in the circuit board and affixed by use of standard riveting methods.

For some applications, it is also desirable to taper the shoulder of the terminal on the side which abuts the circuit board. For use with thick multilayer laminated circuit boards, the end which is to extend through and be swaged to the circuit board must be longer. Other variations of the basic design will suggest themselves for different applications.

One end 28 of the terminal is dimensioned for either a snug or a press fit in an aperture 20 in a circuit board. The inside diameter 16 of the tubular terminal is chosen so as to receive the lead 30 of a component such as a resistor 32 or capacitor. The relative shape, position and proportions of the shoulder, insertion end and welding end of the cylinder, may be varied for particular applications. FIGS. 3 and 4 illustrate insertion and swaging respectively.

The next step after machining the terminal 12 is insertion into an aperture 20 in a circuit board. Such a board will have conductive material 22 on one or both surfaces surrounding the aperture. After insertion to a depth where the shoulder 14 abuts the conductive material on one side of the board, the end 28 of the terminal protruding through the other side is swaged 34 into engagement with the board. Monel is tough enough to give a good mechanical bond after swaging, and the terminal is held firmly in place. The terminal may then be soldered or glued with conductive cement to the conductive material on the board surrounding the aperture. For completeness, the solder connections 35 to conductive material on both sides of the board are shown in FIG. 5.

The primary purpose of such a terminal is to make reliable connections between the circuit board conductive material and circuit components such as resistors and capacitors. Therefore, as the next step in the method claimed, a lead 30 from one of such components is inserted in the shouldered end of the terminal. This lead may be partially inserted, as in the drawings, or inserted until it is flush with the swaged end of the terminal.

Many other insertion methods suggest themselves; for example, the component lead may be inserted all the way through the terminal to extend beyond the other end for connection to other circuit components. After insertion, the fit is preferably a snug one to give rigidity and to hold the component in place for welding, or soldering if preferred.

In the prior art one electrode of a resistance welder was clamped to the terminal and the other to the component lead. In many instances, trouble was experienced with electrode "sticking." Unlike the prior art, the next step is to clamp the electrodes 36 of a resistance welder to both sides of the cylindrical projection of the terminal enclosing the end of the component lead. Current is then applied to the electrodes by means of a standard electronic timer to produce two welds 38 between the terminal and the enclosed lead. These welds join the lead and the two sides of the terminal directly in the current path of the electrodes. Because the resistance of the terminal wall 40 is so much higher than that of the component lead, the current takes a substantially direct path between the two electrodes rather than following the circumferential path of the walls of the terminal. This produces a weld at the side of the terminal where the current leaves the terminal wall to enter the component lead. It also produces another weld where the current leaves the component lead to re-enter the opposite part of the terminal wall. In order to get this direct path, it is important for the terminal to be of high resistivity compared to the material of any component lead which may be inserted. Monel has such a high resistivity—approximately thirty times that of copper.

Although the junctions 42 of the electrodes and the terminal are also in the direct path between the electrodes taken by the welding current, no welds are formed at these junctions. When such welds do occur, they are commonly known as "sticking" of the electrode to the terminal and are usually very low grade welds, which easily pull apart.

The reason that no "sticking" occurs with the unique terminal described in this invention is that, regardless of the material of the inserted component lead, the electrodes only contact the sides of the R-Monel terminal. The thermal and electrical conductivities of the R-Monel terminal are always much less than the electrical and thermal conductivities of electrodes in common use, and this prevents fusion unless the pressure or timing interval settings are grossly improper. Thus, with techniques utilizing the new tubular terminal, it is not necessary to choose a different electrode for each type component lead material in order to prevent "sticking," i.e. welding to the electrodes. On the other hand, in the old techniques using standard connectors, where the electrodes are directly contacting the component lead, "sticking" is very common unless the electrode is carefully chosen for the component lead material being welded.

One of the most advantageous features of the present invention is that the welder will weld any lead material inserted into the Monel terminal with the same electrode. This one feature goes a long way toward reducing the skill requirements of the welder in order to secure an optimum weld strength.

Because the electrodes only contact the outside surface of the tubular terminal during the welding operation, the material of the terminal is of controlling importance in setting the welding conditions for different types of lead materials. Since the Monel material is controlling, the settings remain substantially constant for a wide range of component lead materials, and it is possible to get optimum welds with either a simple noncritical adjustment of the welder timer or with no adjustment at all. The fact that the adjustment is non-critical makes it possible for unskilled welders to secure reliable connections on a continuous basis.

Reference is made to related U.S. patent applications Serial No. 134,248 filed August 28, 1961, entitled "Electrical Connections," and Serial No. 164,359 filed January 4, 1962, entitled "Welded Circuit Board Technique." Both of these inventions are assigned to the assignee of the present invention.

Neither of these inventions anticipates the present invention, because both deal with a method for making complete printed circuits out of a unitary metal structure of nickel or some similar metal. They deal with a method for manufacturing such circuits. The present invention contemplates a single eyelet which is manufactured by machining as opposed to the electroplating methods shown in the other applications. Also, the present invention utilizes Monel or similar alloys which represent a vast improvement for welding and soldering properties over the pure nickel used in the other two inventions.

To restate the advantages of the invention, the present novel terminal connector serves to provide a highly reliable connection between a circuit component, as typified by a resistor, and a circuit board. Such a connection is easily welded by unskilled personnel without a change of electrode for different component leads, and is held firmly in place for welding without the aid of holding devices. The welding time interval settings are noncritical and good welds may easily be secured by unskilled personnel welding without the aid of holding devices. Such a connector also is highly machinable for economical manufacture, and is solderable for applications where such a connection is desired in lieu of welding.

It is to be understood that the above described arrangements are illustrative of the principles of invention. Numerous other arrangements and materials may be devised by those skilled in the art without departing from the spirit and scope of the invention. Thus, by example and not by way of limitation, other copper alloys having properties similar to those of Monel and silicon bronze A may be employed. In addition, mechanical changes which do not depart significantly from the simplicity of applicant's structure may be employed.

Accordingly, from the foregoing remarks, it is to be understood that the present invention is to be limited only by the spirit and scope of the appended claims.

What is claimed is:

1. A method comprising the steps of:

machining elements of copper alloy metal into the form of shouldered, tubular terminals;

inserting the terminals through holes in an insulator board having conductive material constituting an electrical circuit, so that the shouldered portion of each terminal abuts one side of the board and the ends of each terminal extend beyond the board in both directions;

reshaping the inserted end of each terminal into engagement with the board to securely hold the terminals in place;

electrically and mechanically bonding the terminals to conductive material on the circuit board;

inserting conductive leads of various metals with higher thermal and electrical conductivity than copper alloy into the terminals;

clamping the terminals enclosing leads of different materials between welding electrodes of a single material to bring the terminals into engagement with the inserted leads; and welding the terminals to the leads by the application of welding current to the electrodes.

2. A method comprising the steps of:

machining elements of a weldable high resistance copper alloy into the form of weldable terminals with tubular portions;

inserting the terminals through holes in an insulator board so that the shouldered portion of each terminal abuts one side of the board and the ends of each terminal extend beyond the board in both directions;

deforming the inserted end of each terminal into engagement with the board to securely hold the terminals in place;

electrically and mechanically bonding the terminals to conductive material on the circuit board;

inserting conductive leads of various metals with higher thermal and electrical conductivity than said copper alloy into the terminals;

clamping the terminals enclosing leads of different materials between welding electrodes of a single material to bring the terminals into engagement with the inserted leads; and welding the terminals to the leads at more than one area along the matching surfaces of each lead and associated terminal by the application of welding current to the electrodes.

3. A method comprising the steps of:

machining elements of copper alloy metal into the form of shouldered terminals with hollow portions, said copper alloy comprising at least 20% copper alloyed sufficiently to reduce its thermal conductivity below 0.1 calories per square centimeter per centimeter per ° C. per second and to increase its electrical resistivity to at least 140 ohms per circular mil foot;

electrically and mechanically bonding the terminals to conductive material on an insulator board and to the board itself, said mechanical bond being achieved by extending the terminal through the board to engage the shoulder on the conductive material on one side of said board, and deforming the portion of said terminal extending through said board into engagement with the other side of said board;

inserting conductive leads into the terminals;

applying welding electrodes to the portion of each terminal enclosing a conductive lead; and welding each terminal and conductive lead at more than one area along the matching surfaces of each lead and associated terminal by applying current through said electrodes.

4. In combination, an assembly providing a rugged and reliable circuit comprising:

a terminal board with apertures;

shouldered tubular terminals inserted in said apertures and terminal board;

circuit components with wire leads of various materials inserted into said terminals; and a weld on each side of the component leads joining them in at least two places to the inner surface of the tubular terminals.

5. In combination, an assembly providing a rugged and reliable circuit comprising:

a circuit board with apertures and with conductive material on the board surface surrounding each aperture and connected to other apertures;

shouldered tubular terminals inserted in said apertures connected to said circuit board and said conductive material, said terminals being of weldable high resistance material;

circuit components with wire leads of various materials inserted into said terminals; said leads having a conductivity which is at least twice that of said terminals; and a weld on each side of the component leads joining them in at least two places to the inner surface of the tubular terminals.

6. An assembly as defined in claim 5 wherein the terminal is made of a copper alloy including at least 20 percent copper and other alloying constituents sufficient to increase the resistance to above 140 ohms per circular mil foot and reduce the thermal conductivity to below 0.1 calories per square centimeter per centimeter per ° C. per second.

7. A combination as defined in claim 5 wherein said shouldered terminal is secured into said circuit board by engagement of one side of the circuit board by the shoulder on said terminal and deforming said terminal into engagement with the other side of said circuit board following insertion of said terminal through said circuit board beyond the said other side of the circuit board.

References Cited by the Examiner

UNITED STATES PATENTS

| | | | |
|---|---|---|---|
| 3,002,481 | 10/61 | Hutters | 339—17 |
| 3,098,951 | 7/63 | Ayer et al. | 317—101 |

LARAMIE E. ASKIN, *Primary Examiner.*

JOHN F. BURNS, *Examiner.*